United States Patent
Strom et al.

(10) Patent No.: US 12,434,431 B2
(45) Date of Patent: Oct. 7, 2025

(54) METHOD FOR MAKING A METAL ISOLATOR BODY AND ASSOCIATED DEVICE INCLUDING THE SAME

(71) Applicant: Harris Corporation, Melbourne, FL (US)

(72) Inventors: Brian C. Strom, Melbourne Beach, FL (US); Christopher A. Corey, Palm Bay, FL (US); Timothy F. McLellan, Parrish, FL (US); Casey L. Fender, Palm Bay, FL (US); Murray T. Hann, Malabar, FL (US)

(73) Assignee: HARRIS CORPORATION, Melbourne, FL (US)

( * ) Notice: Subject to any disclaimer, the term of this patent is extended or adjusted under 35 U.S.C. 154(b) by 789 days.

(21) Appl. No.: 17/656,675

(22) Filed: Mar. 28, 2022

(65) Prior Publication Data

US 2022/0212400 A1 Jul. 7, 2022

Related U.S. Application Data

(62) Division of application No. 15/687,816, filed on Aug. 28, 2017, now abandoned.

(51) Int. Cl.
*B29C 64/153* (2017.01)
*B33Y 10/00* (2015.01)
(Continued)

(52) U.S. Cl.
CPC ............ *B29C 64/153* (2017.08); *B33Y 10/00* (2014.12); *B33Y 80/00* (2014.12);
(Continued)

(58) Field of Classification Search
None
See application file for complete search history.

(56) References Cited

U.S. PATENT DOCUMENTS

| 1,819,893 A | 8/1931 | Greider |
| 3,769,770 A | 11/1973 | Deschamps et al. |

(Continued)

FOREIGN PATENT DOCUMENTS

| CN | 101506569 | 8/2009 |
| CN | 105667837 | 6/2016 |

(Continued)

OTHER PUBLICATIONS

Machine translation of JPH08250879A via EPO, translated Dec. 30, 2024 (Year: 1996).*

(Continued)

*Primary Examiner* — Elizabeth Collister
(74) *Attorney, Agent, or Firm* — ALLEN, DYER, DOPPELT, + GILCHRIST, P.A.

(57) ABSTRACT

A method for making a metal isolator body to be positioned between a heat sensitive component and a heat source includes obtaining at least a thermal conductivity specification and a load specification for the metal isolator body, and generating a metal isolator body design including solid regions and lattice regions to meet at least the thermal conductivity specification and the load specification. Three dimensional (3D) metal printing is used to form the metal isolator body based upon the metal isolator body design.

13 Claims, 4 Drawing Sheets

(51) Int. Cl.
*B33Y 80/00* (2015.01)
*H01L 21/48* (2006.01)
*H01L 23/34* (2006.01)
*H01L 23/367* (2006.01)
*B22F 10/28* (2021.01)

(52) U.S. Cl.
CPC .......... *H01L 21/4882* (2013.01); *H01L 23/34* (2013.01); *H01L 23/367* (2013.01); *H01L 23/3675* (2013.01); *B22F 10/28* (2021.01)

(56) References Cited

U.S. PATENT DOCUMENTS

| | | | |
|---|---|---|---|
| 9,595,653 B2 | 3/2017 | Mitrovic et al. | |
| 2004/0036161 A1 | 2/2004 | Williams et al. | |
| 2013/0083488 A1* | 4/2013 | Watanabe | H01L 23/4006 257/E23.083 |
| 2013/0199770 A1* | 8/2013 | Cherian | H01L 23/367 165/185 |
| 2014/0059971 A1 | 3/2014 | Jelle et al. | |
| 2014/0160684 A1* | 6/2014 | Wittenberg | H01L 23/34 174/252 |
| 2014/0183307 A1 | 7/2014 | Bullard | |
| 2014/0231837 A1 | 8/2014 | Singer et al. | |
| 2016/0069622 A1* | 3/2016 | Alexiou | B23P 15/26 219/76.1 |
| 2017/0219301 A1 | 8/2017 | Lin | |
| 2018/0055227 A1 | 3/2018 | Jones et al. | |
| 2018/0356168 A1 | 12/2018 | Ghioni et al. | |

FOREIGN PATENT DOCUMENTS

| | | |
|---|---|---|
| CN | 106180720 | 12/2016 |
| JP | H08250879 A * | 9/1996 |
| JP | 2016031845 | 3/2016 |
| WO | WO2013025115 | 2/2016 |

OTHER PUBLICATIONS

Zhang et al. "Inkjet printing of polyimide insulators for the 3D printing of dielectric materials for microelectronic applications" J. Appl. Polym. Sci. 2016; pp. 11. See U.S. Appl. No. 15/687,816.

Meisel et al. "Lightweight Metal Cellular Structures via Indirect 3D Printing and Casting" Design, Research, and Education for Additive Manufacturing Systems Laboratory Department of Mechanical Engineering Virginia Polytechnic Institute and State University; Accepted Aug. 16, 2012; pp. 15. See U.S. Appl. No. 15/687,816.

Christopher Byrant Williams "Design and Development of a Layer-Based Additive Manufacturing Process for the Realization of Metal Parts of Designed Mesostructure" Doctor of Philosophy in Mechanical Engineering Georgia Institute of Technology: Apr. 2008: pp. 421. See U.S. Appl. No. 15/687,816.

Benedict "3D printied diamond jewelry could become reality as Lockheed Martin patents futuristic 3D printer" http://www.3ders.org/articles/20160805-3d-printed-diamond-jewelry-could-become-reality-as-lockheed-martin-patents-futuristic-printer.html: pp. 7. Aug. 5, 2016; See U.S. Appl. No. 15/687,816.

Nino et al. "3D printed thermal protection system on composite structures" www.engineeringvillage.com. International SAMPE Technical Conference, 2014; SAMPE Tech, Seattle 2014 Conference, Jun. 2, 2014-Jun. 5, 2014; Abstract Only See U.S. Appl. No. 15/687,816.

Gibson et al. "Additive Manufacturing Technologies: Rapid Prototyping to Direct Digital Manufacturing" Springer. p. 152-153 (2010) See U.S. Appl. No. 15/687,816.

Merriam-Webster online dictionary definition of "lattice" retrieved on Apr. 10, 2020 (Year: 2020) See Priority U.S. Appl. No. 15/687,816, filed Aug. 28, 2017.

* cited by examiner

METHOD FOR MAKING A METAL ISOLATOR BODY AND ASSOCIATED DEVICE INCLUDING THE SAME

RELATED APPLICATIONS

This application is a divisional of application Ser. No. 15/687,816 filed Aug. 28, 2017, which is hereby incorporated herein in its entirety by reference.

GOVERNMENT RIGHTS

This invention was made with government support under classified government contract. The government has certain rights in the invention.

TECHNICAL FIELD

The present invention relates to the field of thermal isolators, and more particularly, to a method of making a thermally isolated body out of a thermally conductive metal and corresponding device including the same.

BACKGROUND

Thermal isolators are used to isolate heat sources from heat sensitive components. For example, space systems in general experience extreme changes in temperature when orbiting the earth. Extreme temperature changes can have adverse effects on heat sensitive components within the space systems. Thermal isolators block or slow the flow of heat from the heat sources to the heat sensitive components.

Design engineers take into account the operating temperature of the heat sensitive components when selecting the type of material to be used as a thermal isolator. Low thermal conductivity materials such as thermoplastics and ceramics are typically used as thermal isolators.

A problem for design engineers is that thermal isolators are often in contact with metal assemblies that make up the rest of the system. These metal assemblies include the heat sensitive components and the heat sources. Even though thermoplastics and ceramics are good thermal isolators, they have mechanical properties that are different than the metal assemblies.

When thermoplastic is introduced into a metal assembly as a thermal isolator, it begins to soften at high temperatures. When the high temperatures approach 200° C. the thermoplastic starts to break down. In contrast, ceramic can withstand a higher temperature limit above 200° C. but is much stiffer and more brittle than the surrounding metal components.

Design engineers may have to compromise system parameters of the metal assemblies, such as stiffness or operating temperature, to isolate heat sensitive components. Operating temperatures of the metal assemblies may be curtailed by thermoplastic limitations, whereas reliability of the metal assemblies may be reduced by ceramic durability limitations.

As an alternative to thermoplastics and ceramics, a metal such as titanium may be used as a thermal isolator because it has a lower conductivity than other metals typically found in aerospace assemblies. Even though titanium maintains the structural integrity of the metal assembly, there is a coefficient of thermal expansion (CTE) mismatch with the metal assembly. Consequently, there may be a need for a thermal isolator for a metal assembly for isolating a heat sensitive component from a heat source without compromising system parameters.

SUMMARY

A method for making a metal isolator body to be positioned between a heat sensitive component and a heat source includes obtaining at least a thermal conductivity specification and a load specification for the metal isolator body, generating a metal isolator body design including solid regions and lattice regions to meet at least the thermal conductivity specification and the load specification, and using three dimensional(3D) metal printing to form the metal isolator body based upon the metal isolator body design.

The 3D metal printing advantageously allows a thermal isolator to be formed out of a thermally conductive metal by being able to print the lattice regions that are used to tailor the thermal properties of the metal isolator body to meet the thermal conductivity specification. The ability to create a thermal isolator out of metal means that design engineers may no longer have to compromise system parameters, such as stiffness or operating temperature, to isolate heat sensitive components.

The method may further comprise obtaining a coefficient of thermal expansion (CTE) specification for the metal isolator body, and generating the metal isolator body design including solid regions and lattice regions to also meet the CTE specification. The metal isolator body may thus comprise a same metal as at least one of the heat source and the heat sensitive component.

The metal isolator body may comprise a cold face to be positioned adjacent the heat sensitive component, and a hot face to be positioned adjacent the heat source. The metal isolator body may have at least one fastener receiving passageway extending between the cold face and the hot face.

Generating the metal isolator body design may comprise forming a continuous solid region surrounding the at least one fastener receiving passageway. Generating the metal isolator body design may comprise generating the metal isolator body design to include lattice regions exposed on an outer surface of the metal isolator body to permit airflow therethrough.

Generating the metal isolator body design may comprise generating the metal isolator body design so that the metal isolator body has a thermal conductivity less than one tenth a thermal conductivity of a hypothetical solid metal body having a same outer shape as the metal isolator body.

Another aspect is directed to a method for isolating a heat sensitive component from a heat source comprising generating a metal isolator body design including solid regions and lattice regions to meet at least a thermal conductivity specification and a load specification, using three dimensional (3D) metal printing to form the metal isolator body based upon the metal isolator body design, and positioning the metal isolator body between the heat sensitive component and the heat source.

Yet another aspect is directed to a device comprising a housing with a heat sensitive component, a thermal isolator coupled to the housing and comprising a metal isolator body including solid regions and lattice regions to meet at least a thermal conductivity specification and a load specification, and a heat source coupled to the thermal isolator.

DETAILED DESCRIPTION

The present disclosure will now be described more fully hereinafter with reference to the accompanying drawings, in which preferred embodiments of the disclosure are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
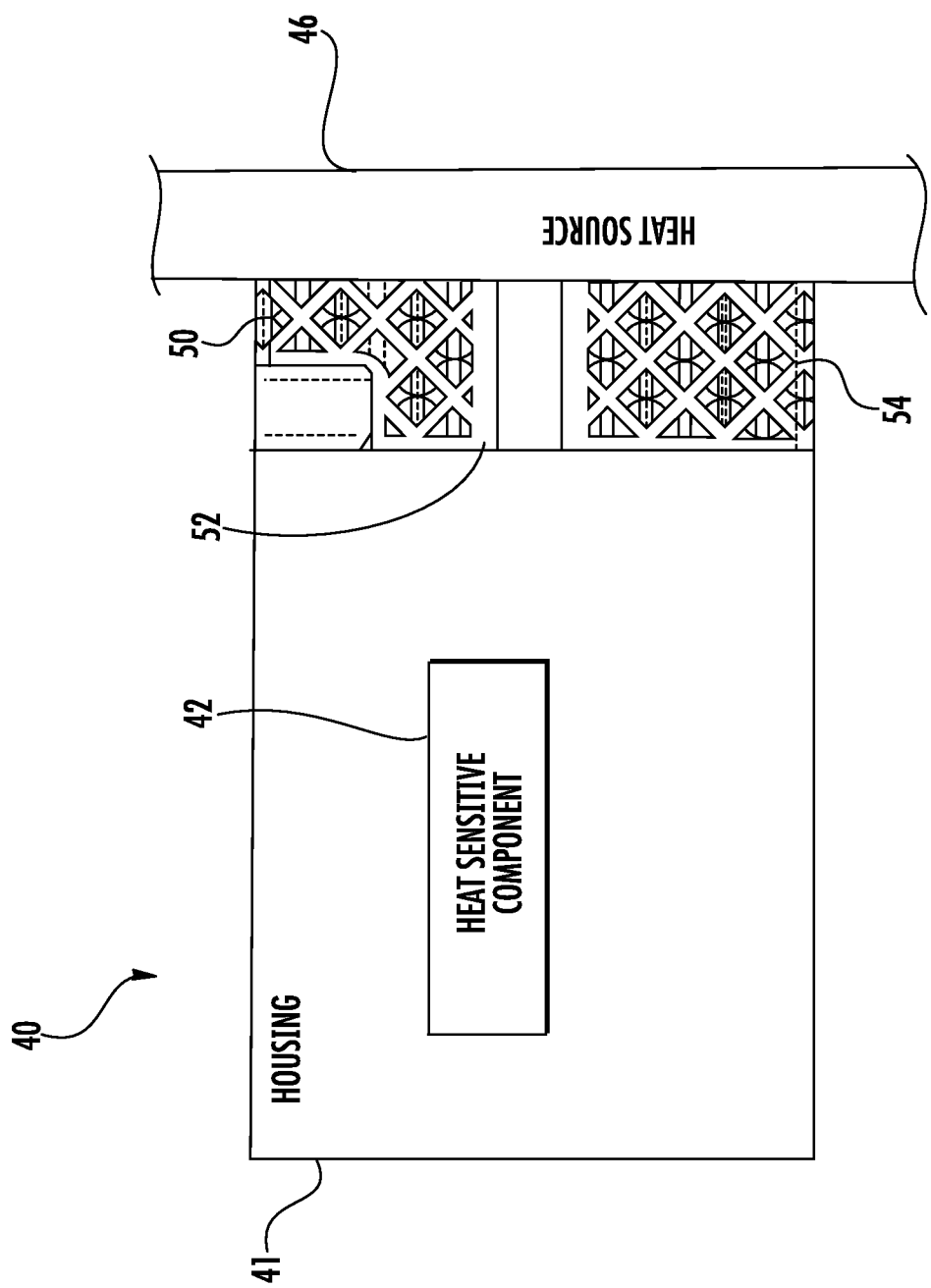
FIG. 1 is a block diagram of a metal assembly with a metal isolator body positioned between a heat sensitive component and a heat source according to the invention.
Figure 2:
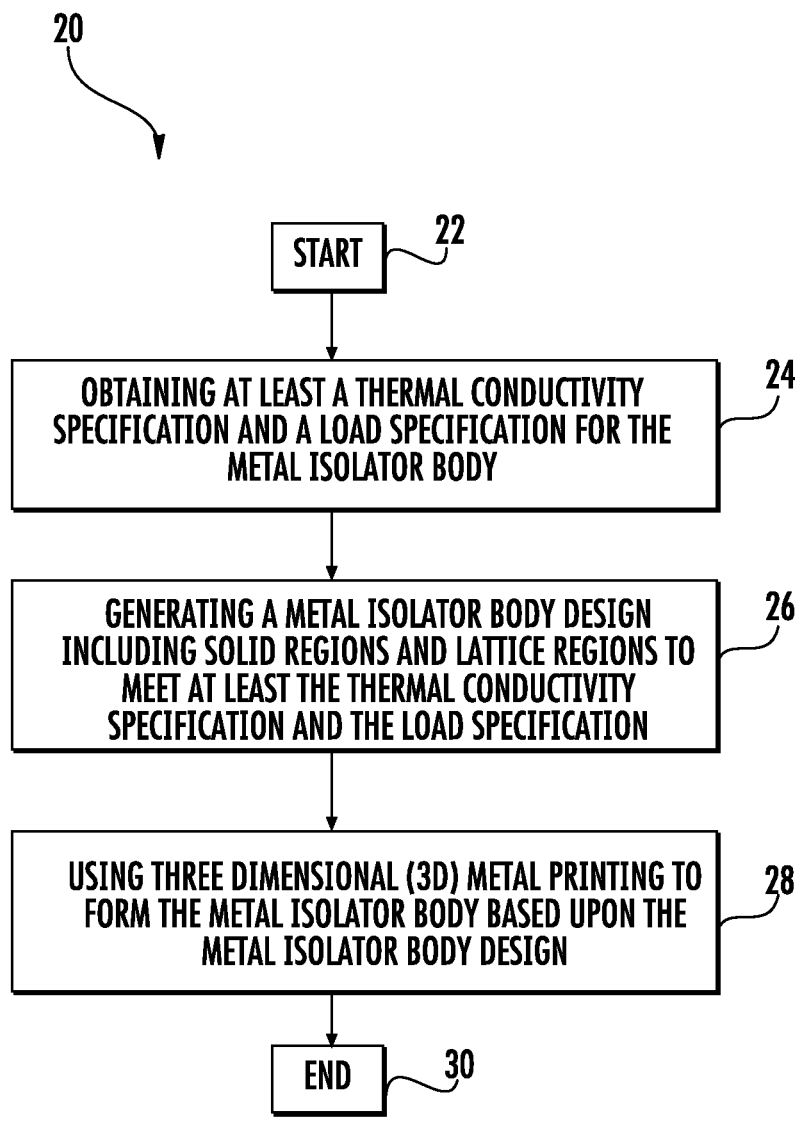
FIG. 2 is a flowchart illustrating a method for making the metal isolator body illustrated in FIG. 1.

Referring initially to FIGS. 1 and 2, a method for making a metal isolator body 50 for a metal assembly 40 will be discussed. The metal assembly 40 includes a heat sensitive component 42 and a heat source 46, and the metal isolator body 50 is to be positioned therebetween.

The metal assembly 40 is not limited to any particular system or setup. As an example, the metal assembly 40 may be part of a satellite where the heat sensitive component 42 is a processor within a transceiver card carried by a metal housing 41, and the heat source 46 is the skin of the satellite. As the skin of the satellite is exposed to sunlight, the skin becomes the heat source 46. The metal housing 41 is in contact with the thermal isolator 50 which is in contact with the skin of the satellite, i.e., the heat source 46.

In the illustrated flowchart 20, the method includes, from the start (Block 22), obtaining at least a thermal conductivity specification and a load specification for the metal isolator body 50 at Block 24, and generating a metal isolator body design at Block 26. The metal isolator body design includes solid regions 52 and lattice regions 54 to meet at least the thermal conductivity specification and the load specification. Three dimensional (3D) metal printing is used at Block 28 to form the metal isolator body 50 based upon the metal isolator body design. The method ends at Block 30.

The 3D metal printing advantageously allows a thermal isolator to be formed out of a thermally conductive metal by being able to print the lattice regions 52 that are used to tailor the thermal properties of the metal isolator body 50 to meet the thermal conductivity specification.

In addition to designing the metal isolator body 50 to meet a thermal conductivity specification and a load specification, the method may further include obtaining a coefficient of thermal expansion (CTE) specification for the metal isolator body 50. The metal isolator body design is generated to also meet the CTE specification.

The metal isolator body 50 may thus be formed from a same metal as at least one of the heat source 46 and the heat sensitive component 42. The ability to create a thermal isolator out of the same metal that may be used to form the rest of the metal assembly 40 means that design engineers may no longer have to compromise system parameters, such as stiffness or operating temperature, to isolate heat sensitive components 42.

Figure 3:
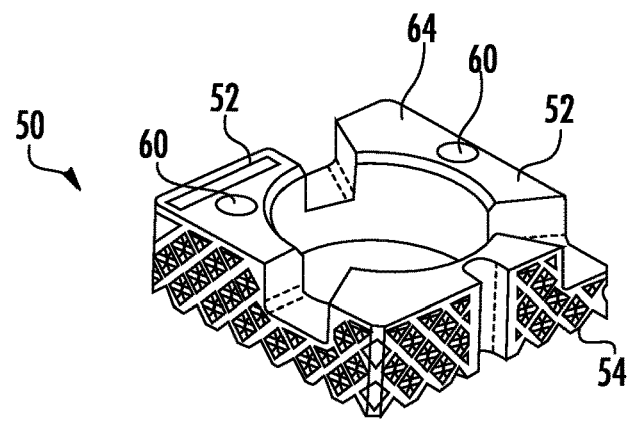
FIG. 3 is an upper perspective view of the metal isolator body illustrated in FIG. 1.
Figure 4:
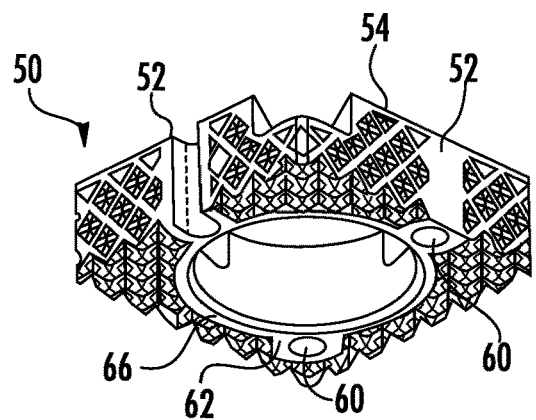
FIG. 4 is a lower perspective view of the metal isolator body illustrated in FIG. 1.
Figure 5:
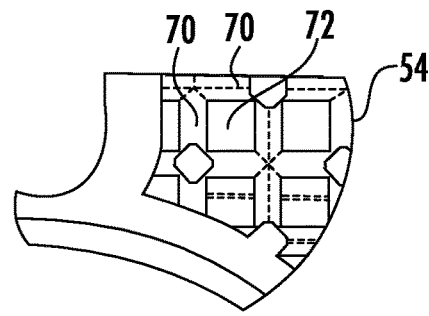
FIG. 5 is a close-up partial view of the lattice regions in the metal isolator body illustrated in FIGS. 4 and 5.

An example metal isolator body 50 will now be discussed in reference to FIGS. 3-5. The illustrated metal isolator body 50 is designed to meet a thermal conductivity specification and a load specification. The solid regions 52 allow the metal isolator body 50 to meet the load specification, while the lattice regions 54 provide strength but also allow the metal isolator body 50 to meet the thermal conductivity specification. The metal isolator body 50 may have other sizes or shapes as will be appreciated by those skilled in the art. The orientation and positioning of the solid and lattice regions 52, 54 will be based on the predetermined thermal conductivity and load specifications supporting the intended application of the metal isolator body 50.

The metal isolator body 50 includes a cold face 62 to be positioned adjacent the heat sensitive component 42, and a hot face 66 to be positioned adjacent the heat source 46. The solid regions 52 correspond to fastener receiving passageways 60 extending between the cold face 62 and the hot face 66, where a continuous solid region 52 surrounds each fastener receiving passageway 60.

The lattice regions 54 are exposed on an outer surface of the metal isolator body 50 to permit airflow therethrough. The lattice regions 54 include metal lines or sections 70 coupled together with square or diamond-shaped spaces 72 left between, as best illustrated in FIG. 5. The square or diamond-shaped spaces 72 advantageously may define an overwhelming majority of the volume of the metal isolator body 50. The conductivity of air is several orders of magnitude lower than that of most metals which allows the metal isolator body 50 to function as a thermal isolator. Of course, the metal isolator body 50 may also be used in a vacuum environment, such as in space. The 3D printing allows geometries such as the lattice regions 54 to be obtained. Without 3D printing, forming lattice regions in a metal isolator body may be extremely difficult. A powder bed fusion (PDF) process may be used for 3D printing. Powder bed fusion includes the following commonly used printing techniques: direct metal laser sintering (DMLS), electron beam melting (EBM), selective heat sintering (SHS), selective laser melting (SLM) and selective laser sintering (SLS). The powder bed fusion (PBF) methods use either a laser or electron beam to melt and fuse material powder together. Of course, other 3D printing techniques may be used, as readily appreciated by those skilled in the art.

As readily understood by those skilled in the art, thermal conductivity is the property of a body to conduct heat. Heat transfer occurs at a lower rate across a body of lower thermal conductivity than across a body of higher thermal conductivity. For comparison purposes, the illustrated metal isolator body 50 may have a have a thermal conductivity less than one tenth a thermal conductivity of a hypothetical solid metal body having a same outer shape as the metal isolator body.

Figure 6:
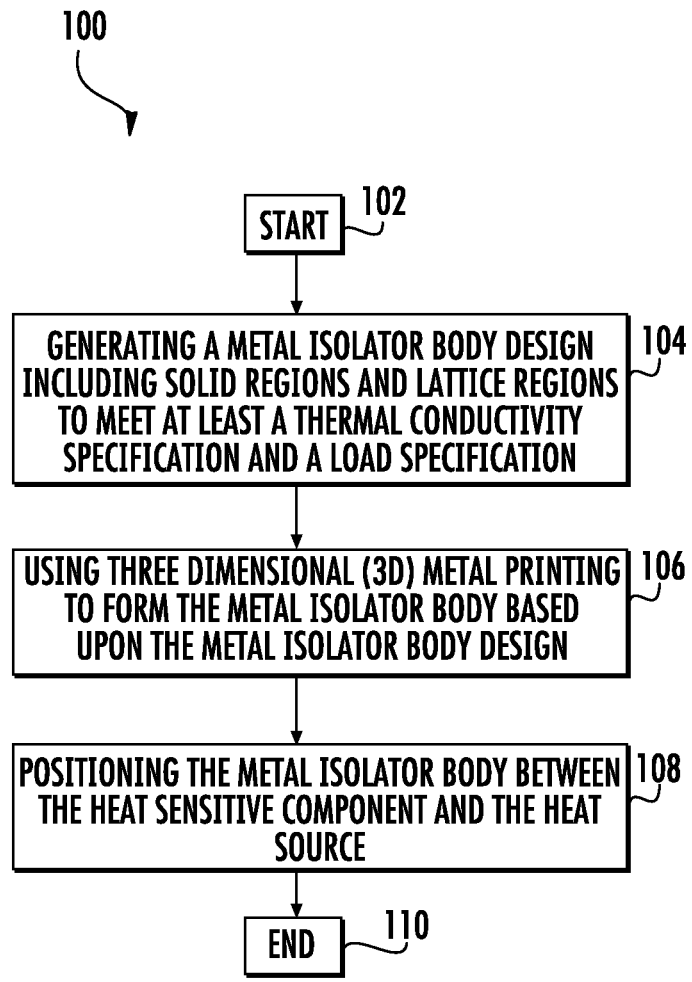
FIG. 6 is a flowchart illustrating a method for isolating the heat sensitive component from the heat source illustrated in FIG. 1.

Another aspect is directed to a method for isolating the heat sensitive component 42 from the heat source 46. Referring now to the flowchart 100 illustrated in FIG. 6, the method includes, from the start (Block 102), generating a metal isolator body design including solid regions 54 and lattice regions 52 to meet at least a thermal conductivity specification and a load specification at Block 104. Three dimensional (3D) metal printing is used at Block 106 to form the metal isolator body 50 based upon the metal isolator body design. The method further includes positioning the metal isolator body 50 between the heat sensitive component 42 and the heat source 46 at Block 108. The method ends at Block 110.

Yet another aspect is directed to a device 40 comprising a housing 41 with a heat sensitive component 42, and a thermal isolator coupled to the housing and comprising a metal isolator body 50 including solid regions 52 and lattice regions 54 to meet at least a thermal conductivity specification and a load specification. A heat source 46 is coupled to the thermal isolator.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

The invention claimed is:

1. A device comprising:
   a heat sensitive component; and
   a metal isolator body having a cold face and a hot face opposite the cold face, the cold face adjacent said heat sensitive component and the hot face adjacent a heat source;
   said metal isolator body having a volume that includes solid regions and lattice regions between the cold face and the hot face,
      with the solid regions continuously extending between the cold face and the hot face and having at least one fastener receiving passageway extending therebetween, and
      with the lattice regions defining a majority of the volume of the metal isolator body, the lattice regions in contact with the solid regions and being exposed on an outer surface between the cold face and the hot face to permit airflow therethrough.

2. The device according to claim 1 wherein said heat sensitive component is coupled to the cold face of said metal isolator body.

3. The device according to claim 1 wherein the hot face of said metal isolator body is coupled to the heat source.

4. The device according to claim 1 wherein the at least one fastener receiving passageway of said metal isolator body is surrounded by a continuous solid region.

5. The device according to claim 1 wherein the at least one fastener receiving passageway extends through the cold and hot faces of said metal isolator body.

6. The device according to claim 1 wherein the lattice regions include metal lines coupled together with square-shaped spaces between the metal lines.

7. The device according to claim 1 wherein said heat sensitive component comprises a processor.

8. A metal assembly comprising:
   a metal housing;
   a heat sensitive component within said metal housing;
   a heat source adjacent said metal housing; and
   a metal isolator body having a cold face and a hot face opposite the cold face, the cold face coupled to said metal housing and the hot face coupled to said heat source;
   said metal isolator body having a volume that includes solid regions and lattice regions between the cold face and the hot face,
      with the solid regions continuously extending between the cold face and the hot face and having at least one fastener receiving passageway extending therebetween, and
      with the lattice regions defining a majority of the volume of the metal isolator body, the lattice regions in contact with the solid regions and being exposed on an outer surface between the cold face and the hot face to permit airflow therethrough.

9. The metal assembly according to claim 8 wherein the at least one fastener receiving passageway of said metal isolator body is surrounded by a continuous solid region.

10. The metal assembly according to claim 8 wherein the at least one fastener receiving passageway extends through the cold and hot faces of said metal isolator body.

11. The metal assembly according to claim 8 wherein the lattice regions include metal lines coupled together with square-shaped spaces between the metal lines.

12. The metal assembly according to claim 8 further comprising a transceiver carried by said metal housing, with said heat sensitive component comprising a processor within said transceiver.

13. The metal assembly according to claim 8 is configured as a satellite, with said heat source functioning as skin of the satellite.

* * * * *